US011227746B2

(12) United States Patent
Bonecutter et al.

(10) Patent No.: US 11,227,746 B2
(45) Date of Patent: Jan. 18, 2022

(54) ISOLATED BACKSIDE HELIUM DELIVERY SYSTEM

(71) Applicant: Applied Materials, Inc., Santa Clara, CA (US)

(72) Inventors: Luke Bonecutter, Cedar Park, TX (US); Abhijit Kangude, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/980,931

(22) PCT Filed: Feb. 20, 2019

(86) PCT No.: PCT/US2019/018675
§ 371 (c)(1),
(2) Date: Sep. 15, 2020

(87) PCT Pub. No.: WO2019/182709
PCT Pub. Date: Sep. 26, 2019

(65) Prior Publication Data
US 2020/0411283 A1      Dec. 31, 2020

Related U.S. Application Data

(60) Provisional application No. 62/647,102, filed on Mar. 23, 2018.

(51) Int. Cl.
*H01J 37/32* (2006.01)
*H01L 21/67* (2006.01)

(52) U.S. Cl.
CPC .... *H01J 37/3244* (2013.01); *H01J 37/32174* (2013.01); *H01L 21/67103* (2013.01)

(58) Field of Classification Search
CPC ............ H01J 37/3244; H01J 37/32174; H01L 21/67103; H01L 21/67; H01L 21/683; H01L 21/67017; H01L 21/02274
(Continued)

(56) References Cited

U.S. PATENT DOCUMENTS 4,565,601 A * 1/1986 Kakehi ................. C23C 14/541
156/345.27
4,645,895 A * 2/1987 Boxman .............. B23K 28/003
118/50.1
(Continued)

FOREIGN PATENT DOCUMENTS

JP      2009218607 A    9/2009
JP      2017201713 A    11/2017

OTHER PUBLICATIONS

International Search Report/Written Opinion issued to PCT/2Q19/018675 dated Jun. 5, 2019.
(Continued)

*Primary Examiner* — Rudy Zervigon
(74) *Attorney, Agent, or Firm* — Patterson + Sheridan, LLP

(57) ABSTRACT

Embodiments described herein provide a backside gas delivery assembly that prevents inert gas from forming parasitic plasma. The backside gas delivery assembly includes a first gas channel disposed in a stem of a substrate support assembly. The substrate support assembly includes a substrate support having a second gas channel extending from the first gas channel. The backside gas delivery assembly further includes a porous plug disposed within the first gas channel positioned at an interface of the stem and the substrate support, a gas source connected to the first gas channel configured to deliver an inert gas to a backside surface of a substrate disposed on an upper surface of the substrate support, and a gas tube in the first gas channel
(Continued)

extending to the porous plug positioned at the interface of the stem and the substrate support.

20 Claims, 3 Drawing Sheets

(58) Field of Classification Search
USPC .............. 118/724, 725, 723 E; 156/345.51, 156/345.52, 345.53, 345.43, 345.44, 156/345.45, 345.46, 345.47
See application file for complete search history.

(56) References Cited

U.S. PATENT DOCUMENTS

| | | | |
|---|---|---|---|
| 5,542,559 A * | 8/1996 | Kawakami | H01L 21/6838 216/67 |
| 5,775,416 A * | 7/1998 | Heimanson | C23C 14/50 118/725 |
| 5,835,334 A * | 11/1998 | McMillin | H01L 21/67109 361/234 |
| 6,378,600 B1 | 4/2002 | Moslehi | |
| 6,500,299 B1 * | 12/2002 | Mett | C23C 16/4402 118/723 E |
| 6,605,177 B2 * | 8/2003 | Mett | C23C 16/4402 118/728 |
| 7,622,017 B2 * | 11/2009 | Himori | H01L 21/6831 156/345.43 |
| 9,447,518 B2 * | 9/2016 | Hori | C30B 29/403 |
| 10,927,449 B2 * | 2/2021 | Liu | C23C 14/35 |
| 10,984,990 B2 * | 4/2021 | Bokka | H01J 37/32743 |
| 2002/0172764 A1 | 11/2002 | Caldwell et al. | |
| 2008/0226838 A1 * | 9/2008 | Nishimura | C23C 16/4586 427/569 |
| 2018/0209035 A1 * | 7/2018 | Liu | H01J 37/3405 |
| 2018/0308669 A1 * | 10/2018 | Bokka | C23C 16/517 |
| 2019/0378696 A1 * | 12/2019 | Addepalli | C23C 16/50 |
| 2021/0296101 A1 * | 9/2021 | Prouty | H01L 21/67069 |

OTHER PUBLICATIONS

Taiwan Office Action dated Jul. 27, 2020 regarding Taiwan Patent Application No. 108109539.

* cited by examiner

ISOLATED BACKSIDE HELIUM DELIVERY SYSTEM

BACKGROUND

Field

Embodiments of the present disclosure generally relate to processing chambers and to backside gas delivery assemblies for use therein.

Description of the Related Art

In the manufacture of integrated circuits and other electronic devices, plasma processes are often used for deposition or etching of various material layers. High frequency power, such as a radio frequency (RF) power, is often used to generate the plasma, for example inside a process chamber. When RF power is applied to the substrate support, a direct current (DC) bias is also often applied to the substrate support to chuck the substrate to the substrate support during processing. To improve the thermal uniformity and heat transfer between the substrate support and the substrate during processing an inert gas, such as helium, is delivered to the backside of the substrate by a backside gas delivery assembly.

However, during processing the inert gas flowing through the backside gas delivery assembly may ionize at various points along the backside gas delivery assembly due to the proximity of the backside gas delivery assembly to RF power applied to the substrate support. The ionized inert gas may form parasitic plasma that propagates throughout the backside delivery gas assembly and deposits contaminants, such as metals, on the backside surface of the substrate that are not desired.

Therefore, there is a need for an improved backside gas delivery assembly that prevents inert gas from forming parasitic plasma.

SUMMARY

In one embodiment, a backside gas delivery assembly is provided. The backside gas delivery assembly includes a first gas channel disposed in a stem of a substrate support assembly. The substrate support assembly includes a substrate support having a second gas channel extending from the first gas channel. The backside gas delivery assembly further includes a porous plug disposed within the first gas channel positioned at an interface of the stem and the substrate support.

In another embodiment, a backside gas delivery assembly is provided. The backside gas delivery assembly includes a first gas channel disposed in a stem of a substrate support assembly. The substrate support assembly includes a substrate support having a second gas channel extending from the first gas channel. The backside gas delivery assembly further includes a porous plug disposed within the first gas channel positioned at an interface of the stem and the substrate support, a gas source connected to the first gas channel configured to deliver an inert gas to a backside surface of a substrate disposed on an upper surface of the substrate support, and a gas tube in the first gas channel extending to the porous plug positioned at the interface of the stem and the substrate support.

In yet another embodiment, a backside gas delivery assembly is provided. The backside gas delivery assembly includes a first gas channel disposed in a stem of a substrate support assembly. The substrate support assembly includes a substrate support having a second gas channel extending from the first gas channel. The backside gas delivery assembly further includes a porous plug disposed within the first gas channel positioned at an interface of the stem and the substrate support, a gas source connected to the first gas channel configured to deliver an inert gas to a backside surface of a substrate disposed on an upper surface of the substrate support, and a gas tube connected to an electrical ground having an inner diameter between about 0.025 inches and 0.075 inches and an inner surface having a surface finish less than 5 microinches, the gas tube bonded to the first gas channel and extending to the porous plug positioned at the interface of the stem and the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide an improved backside gas delivery assembly that prevents inert gas from forming parasitic plasma. The backside gas delivery assembly includes a first gas channel disposed in a stem of a substrate support assembly. The substrate support assembly includes a substrate support having a second gas channel extending from the first gas channel. The backside gas delivery assembly further includes a porous plug disposed within the first gas channel positioned at an interface of the stem and the substrate support, a gas source connected to the first gas channel configured to deliver an inert gas to a backside surface of a substrate disposed on an upper surface of the substrate support, and a gas tube in the first gas channel extending to the porous plug positioned at the interface of the stem and the substrate support.

Figure 1A:
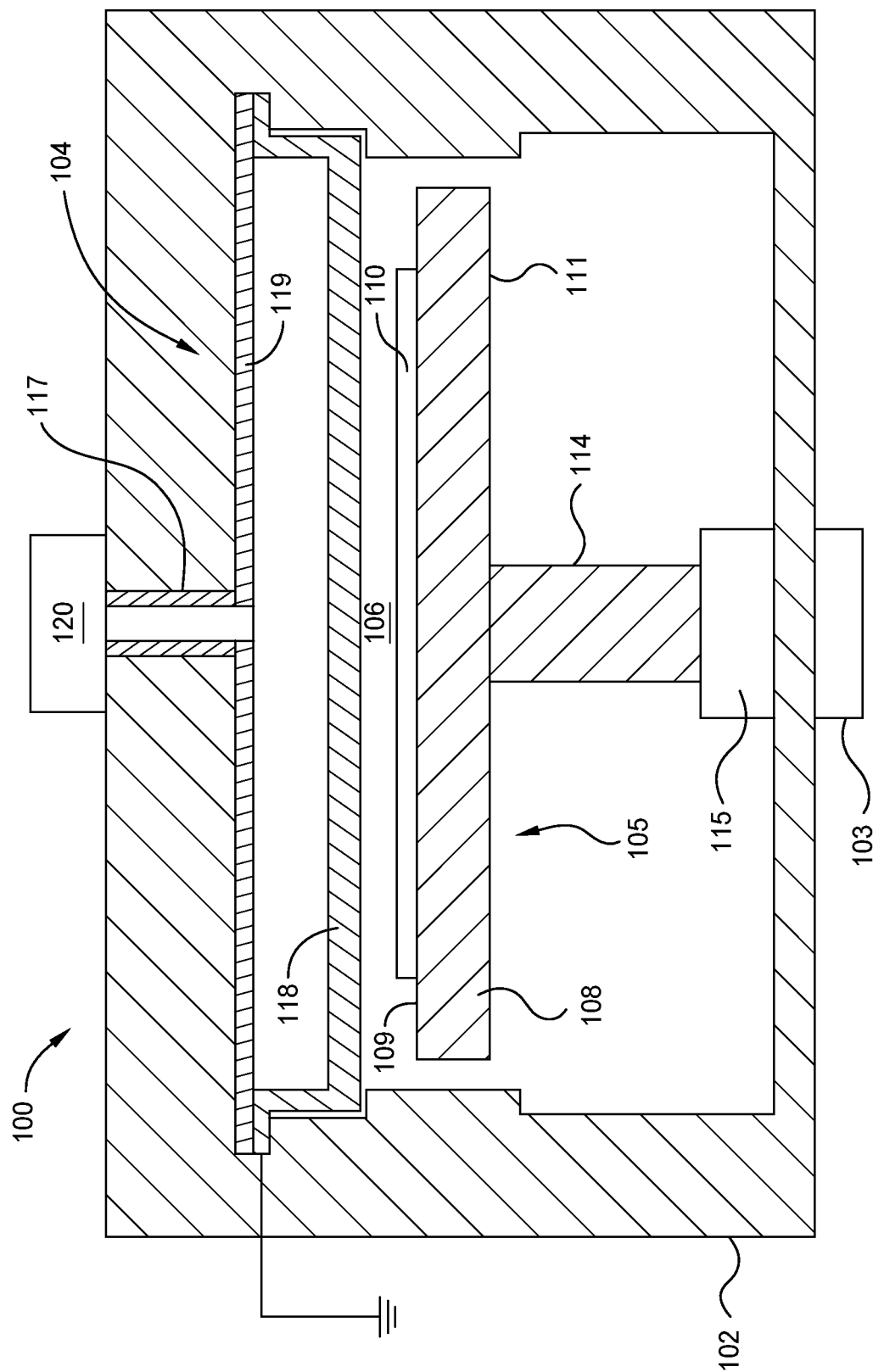
FIG. 1A is a schematic cross-sectional view of a plasma processing chamber according to an embodiment.

FIG. 1A is a schematic cross-sectional view of a plasma processing plasma processing chamber 100, according to one embodiment, available from Applied Materials, Inc. located in Santa Clara, Calif. It is to be understood that the chamber described below is an exemplary chamber and other chambers, including chambers from other manufacturers, may be used with or modified to accomplish aspects of the present disclosure.

The plasma processing chamber 100 includes a chamber body 102, a substrate support assembly 105, and a gas distribution assembly 104 positioned opposite the substrate support assembly 105 and defining a process volume 106 therebetween. The gas distribution assembly is configured to distribute gases uniformly into the process volume 106 of the plasma processing chamber 100 to facilitate deposition of a film onto, or etching of a film from, a substrate 110 positioned on the substrate support assembly 105. The gas distribution assembly 104 includes a gas inlet passage 117, which delivers gas from a gas flow controller 120 into a gas distribution manifold 118 suspended from a hanger plate 119. The gas distribution manifold 118 includes a plurality of holes or nozzles (not shown) through which gaseous mixtures are injected into the process volume 106 during processing. The gas distribution assembly 104 can be connected to an RF return allow RF energy applied to a substrate support 108 to generate an electric field within the process volume 106, which is used to generate the plasma for processing of the substrate 110.

The substrate support assembly 105 includes the substrate support 108, a base 115, a stem 114 connecting the base 115 to the substrate support 108, and a drive system 103. The substrate support assembly 105 is disposed within the interior volume of the plasma processing chamber 100. The substrate support 108 has an upper surface 109 that supports the substrate 110 and a lower surface 111 for mounting the stem 114 to the substrate support 108. In one embodiment, the substrate support 108 is formed from a sintered ceramic material, such as aluminum nitride (AlN), silicon nitride (SiN), silicon carbide (SiC) or the like. The substrate support 108 is movably disposed in the process volume 106 by the stem 114 that is coupled to the drive system 103 located external of the chamber body 102. The stem 114 and base 115 are connected to the drive system 103 and a bellows (not shown) to allow the substrate support 108 to be raised, lowered, and/or rotated.

Figure 1B:
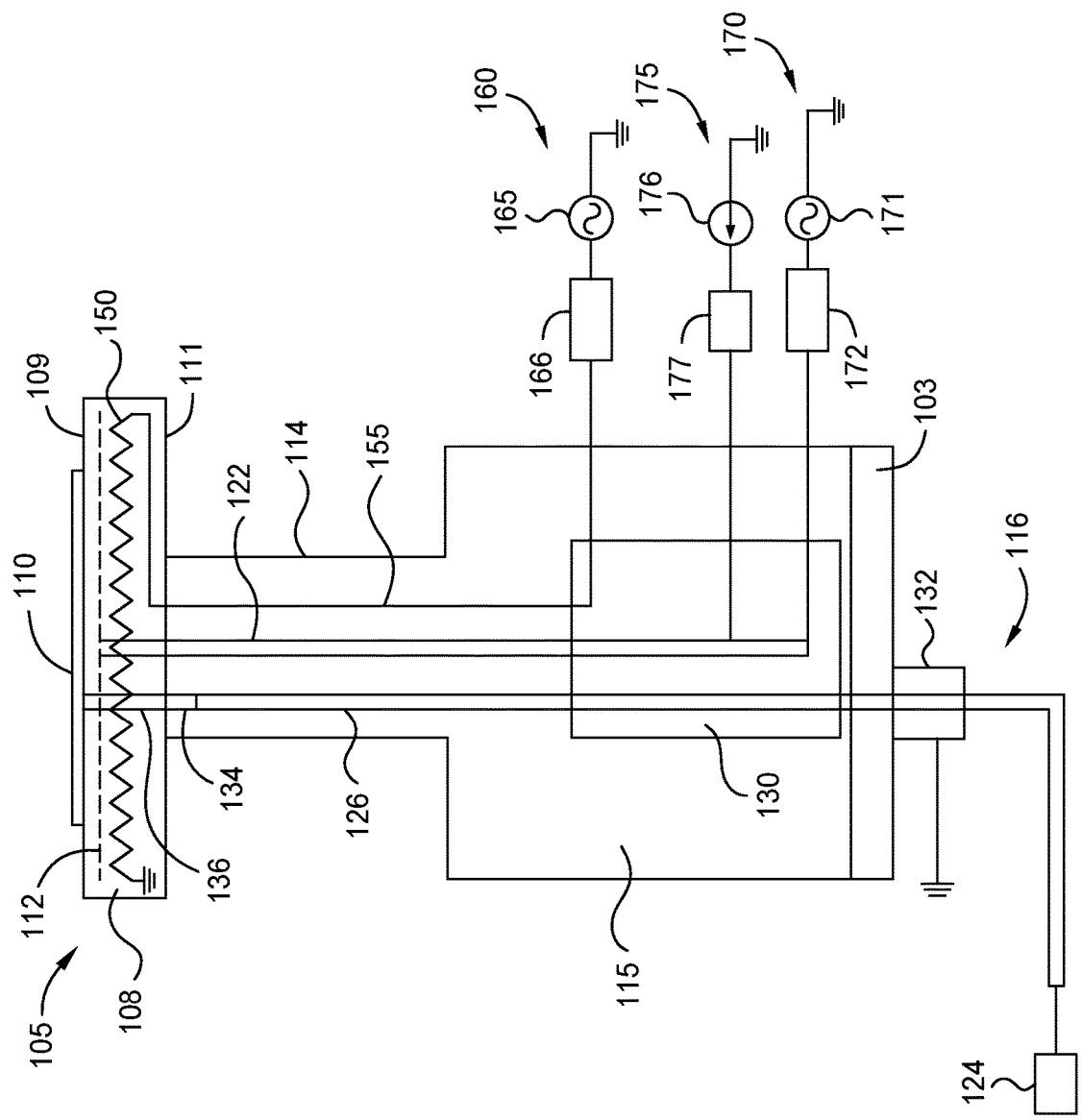
FIG. 1B is an enlarged, schematic cross-sectional view of the substrate support assembly shown in FIG. 1A.

FIG. 1B is an enlarged, schematic cross-sectional view of the substrate support assembly 105. In one embodiment, the substrate support assembly 105 includes an interconnect assembly 130 disposed in the base 115. The interconnect assembly 130 couples a RF circuit 170 and a DC circuit 175 with an electrode 112 disposed within the substrate support 108. In one embodiment, the electrode 112 comprises a conductive mesh, such as a tungsten-, copper-, or molybdenum-containing conductive mesh.

The RF circuit 170 is electrically coupled to the electrode 112 by a conductive rod 122. The RF circuit 170 is configured to generate an electric field in the process volume 106 to create the plasma within the process volume 106 (shown in FIG. 1A) to process the substrate 110. The electric field is generated between the electrode 112 in the substrate support 108 and the gas distribution assembly 104 (shown in FIG. 1A), which is connected to an electrical ground. The RF circuit 170 includes a RF power source 171 and a match circuit 172 coupled between the RF power source 171 and the electrode 112 to facilitate application of RF power to the electrode 112.

The DC circuit 175 is electrically coupled to the electrode 112 by the conductive rod 122. The DC circuit 175 can be used to electrostatically chuck the substrate 110 to the substrate support 108 during processing. The DC circuit 175 can include a DC power source 176 and a RF filter 177 coupled between the DC power source 176 and the electrode 112. The RF filter 177 can be used to protect the DC power source 176 from the high frequency power from the RF circuit 170. The DC power source 176 can be configured to generate a positive or negative DC voltage. A heating circuit 160 is electrically coupled a heating element 150 by a conductive rod 155. The heating circuit 160 further includes a RF filter 166 coupled between the heating power source 165 and the heating element 150. The RF filter 166 is used to protect the heating power source 165 from the high frequency power from the RF circuit 170.

The substrate support assembly 105 further includes a backside gas delivery assembly 116 to provide an inert gas, such as helium, to the backside of the substrate 110. The inert gas can be used to improve the thermal uniformity and heat transfer between the substrate support 108 and the substrate 110 during processing. The backside gas delivery assembly 116 includes a first gas channel 126 connected to a gas source 124. The first gas channel 126 extends through a RF gasket 132, the interconnect assembly 130, and the stem 114. A second gas channel 136 which is disposed in the substrate support 108 extends from the first gas channel 126 forming a continuous gas channel. The second gas channel 136 is utilized to provide the inert gas to the backside surface of the substrate 110. The RF gasket 132 coupled to the first gas channel 126 protects the inert gas inside the first gas channel 126 from ionizing and forming a parasitic plasma due to the presence of RF power. In some examples, the RF gasket 132 may be connected to an electrical ground.

The backside gas delivery assembly 116 further includes a porous plug 134 which is positioned at an interface of the stem 114 and the lower surface 111 of the substrate support 108. The porous plug 134 is disposed within the first gas channel 126. The porous plug 134 has an outer diameter that is approximately the same as the inner diameter of the first gas channel 126 to form an interference fit therebetween. The porous plug 134, formed from a low-density sintered ceramic material, has passages that allow the inert gas to flow through the second gas channel 136 extending from the first gas channel. The porous plug may include aluminium oxide ($Al_2O_3$) and/or aluminium nitride (AlN) containing materials. The porous plug 134 prevents the inert gas inside the first gas channel 126 from ionizing due to the presence of RF power, and thus prevents the formation of a parasitic plasma within the second gas channel 136, for example, by preventing propagating of plasma down the first gas channel 126. A parasitic plasma will only propagate into a space if there is a viable amount of cross-sectional area to allow the parasitic plasma to propagate. The effective cross sections of passageways in the porous plug 134 have cross-sectional areas that prevent ionized inert gas from prorogating through the porous plug 134. The formation of parasitic plasma beneath the substrate 110 may result in the generation of particle contamination, which may deposit on the back side of the substrate 110 and adversely affect final device performance Thus, reduction of backside parasitic plasma is advantageous.

Furthermore, in addition to reducing parasitic plasma, the porous plug 134 further reduces particle contamination by being spaced from (e.g., being in a non-contact configuration with) the substrate 110. Conventional substrate supports formed from sintered ceramic materials have non-uniform compositions. Thus, porous plugs disposed in conventional substrate supports could be displaced due to weak bonds and different ratios of thermal expansion resulting from the non-uniform compositions. Thus, use of a plug, such as the ceramic porous plug 134 disclosed herein, would result in particle contamination if positioned at the distal end of the second gas channel 136 within the substrate support 108, due to expansion/contraction of substrate support 108 relative to the plug. However, the ceramic porous plug 134 of the present disclosure is positioned within the stem 114, which is formed of aluminum or an aluminum alloy, generally having a more uniform composition, and is less subject to particle generation due to relative movement between the porous plug 134 and the stem 114.

Figure 1C:
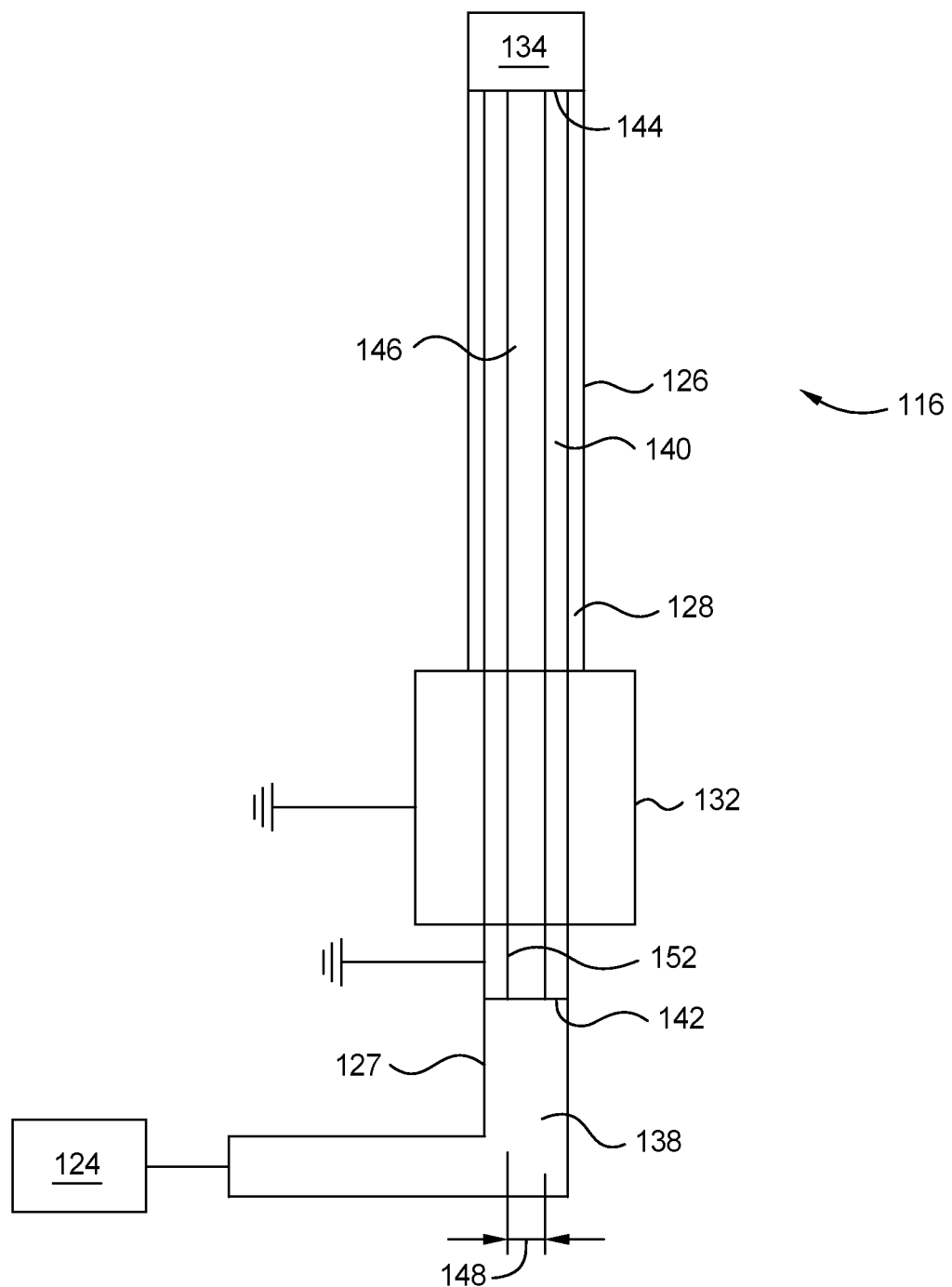
FIG. 1C is an enlarged, schematic cross-sectional view of the backside gas delivery assembly shown in FIG. 1B.

FIG. 1C is an enlarged, schematic cross-sectional view of the backside gas delivery assembly 116. The backside gas delivery assembly 116 further includes a gas tube 140 extending to the porous plug 134 which is positioned at the interface of the stem 114 and the lower surface 111 of the substrate support 108. The gas tube 140 is bonded to an inner surface 127 of the first gas channel 126. In one embodiment, the gas tube 140 has a first end 142 bonded to a first portion 138 of the first gas channel 126 positioned before (e.g., fluidly upstream) the RF gasket 132 and a second end 144 bonded to the porous plug 134. The gas tube 140 may be welded to the first portion 138 of the first gas channel 126 positioned before the RF gasket 132. The gas tube 140 may be connected to an electrical ground to protect inert gas inside the gas tube 140 from ionizing due to the presence of RF power during operation due to the proximity of the backside gas delivery assembly 116 to the RF power and circuitry in the substrate support assembly 105. The porous plug 134 further prevents a formation of the parasitic plasma from propagating down a space 128 between the gas tube 140 and the first gas channel 126 in a second portion 146 of the first gas channel 126.

In one embodiment, the gas tube 140 has inner diameter 148 that is narrow to allow the inert gas to flow through the gas tube 140 while preventing inert gas inside the gas tube 140 from ionizing due to the presence of RF power. In one embodiment, the inner diameter 148 is between about 0.025 inches and 0.075 inches. In another embodiment, the gas tube 140 is formed from electroformed nickel such that the inner surface 152 of gas tube 140 has a surface finish less than 5 microinches (μin). The surface finish of less than 5 μin allows the inert gas to be delivered without trace amounts of contaminants depositing on internal surface of the tube, and subsequently flaking off and contaminating substrates. Also, the electroformed nickel is extremely resistant to temperature and corrosive breakdown that may occur during operation over time, thereby reducing the likelihood of particle generation.

In one example, an improved backside gas delivery assembly that prevents inert gas from forming parasitic plasma that deposits metals or other contaminants on the backside surface of the substrate is described herein. The porous plug which is positioned at the interface of the stem and the lower surface of the substrate support coupled to the second gas channel, allows for a substrate support formed from a sintered ceramic material to be utilized. Additionally, the porous plug prevents inert gas from ionizing and propagating up the second gas channel disposed in the substrate support or down the first gas channel of the gas delivery assembly. The gas tube connected to an electrical ground prevents inert gas inside the gas tube from ionizing and the porous plug bonded to the gas tube further prevents parasitic plasma from propagating down a space between the gas tube and the first gas channel. The gas tube has inner diameter that is narrow to allow the inert gas to flow through the gas tube while preventing inert gas inside the gas tube from ionizing. The gas tube formed from electroformed nickel having the surface finish of less than 5 microinches (pin) allows the inert gas to be delivered without trace amounts of contaminants depositing on internal surface of the tube, and subsequently flaking off and contaminating substrates.

While the foregoing is directed to embodiments of the present disclosure, other and further embodiments of the disclosure may be devised without departing from the basic scope thereof, and the scope thereof is determined by the claims that follow.

What is claimed is:

1. A backside gas delivery assembly, comprising:
    a first gas channel disposed in a stem of a substrate support assembly, the substrate support assembly comprising a substrate support having a second gas channel extending from the first gas channel; and
    a porous plug disposed within the first gas channel positioned at an interface of the stem and the substrate support.

2. The backside gas delivery assembly of claim 1, further comprising a gas source connected to the first gas channel.

3. The backside gas delivery assembly of claim 1, wherein the backside gas delivery assembly is configured to deliver an inert gas to a backside surface of a substrate disposed on an upper surface of the substrate support.

4. The backside gas delivery assembly of claim 1, wherein the first gas channel extends through a RF gasket.

5. The backside gas delivery assembly of claim 4, wherein the RF gasket is connected to an electrical ground.

6. The backside gas delivery assembly of claim 5, further comprising a gas tube in the first gas channel extending to the porous plug positioned at the interface of the stem and the substrate support.

7. The backside gas delivery assembly of claim 6, wherein the gas tube is connected to an electrical ground.

8. The backside gas delivery assembly of claim 6, wherein the gas tube is bonded to an inner surface of the first gas channel.

9. The backside gas delivery assembly of claim 6, wherein the gas tube is welded to a first portion of the first gas channel positioned before the RF gasket.

10. The backside gas delivery assembly of claim 6, wherein the gas tube has an inner diameter between about 0.025 inches and 0.075 inches.

11. The backside gas delivery assembly of claim 10, wherein an inner surface of the gas tube has a surface finish of less than 5 microinches (μin).

12. The backside gas delivery assembly of claim 11, wherein the gas tube is formed from electroformed nickel.

13. A backside gas delivery assembly, comprising:
    a first gas channel disposed in a stem of a substrate support assembly, the substrate support assembly comprising a substrate support having a second gas channel extending from the first gas channel;
    a porous plug disposed within the first gas channel positioned at an interface of the stem and the substrate support;
    a gas source connected to the first gas channel configured to deliver an inert gas to a backside surface of a substrate disposed on an upper surface of the substrate support; and
    a gas tube in the first gas channel extending to the porous plug positioned at the interface of the stem and the substrate support.

14. The backside gas delivery assembly of claim 13, wherein the first gas channel extends through a RF gasket connected to an electrical ground and the gas tube is connected to the electrical ground.

15. A backside gas delivery assembly, comprising:
    a first gas channel disposed in a stem of a substrate support assembly, the substrate support assembly comprising a substrate support having a second gas channel extending from the first gas channel;

a porous plug disposed within the first gas channel positioned at an interface of the stem and the substrate support;

a gas source connected to the first gas channel configured to deliver an inert gas to a backside surface of a substrate disposed on an upper surface of the substrate support; and a gas tube connected to an electrical ground having an inner diameter between about 0.025 inches and 0.075 inches and an inner surface having a surface finish less than 5 microinches, the gas tube bonded to the first gas channel and extending to the porous plug positioned at the interface of the stem and the substrate support.

16. The backside gas delivery assembly of claim 13, wherein the gas tube is bonded to an inner surface of the first gas channel.

17. The backside gas delivery assembly of claim 14, wherein the gas tube is welded to a first portion of the first gas channel positioned before the RF gasket.

18. The backside gas delivery assembly of claim 13, wherein the gas tube has an inner diameter between about 0.025 inches and 0.075 inches.

19. The backside gas delivery assembly of claim 18, wherein an inner surface of the gas tube has a surface finish of less than 5 microinches (μin).

20. The backside gas delivery assembly of claim 19, wherein the gas tube is formed from electroformed nickel.

* * * * *